Inventor.
Michael J. Cudahy
By. Merriam, Smith & Marshall.
Att'ys.

May 25, 1965 M. J. CUDAHY 3,185,768

AMPLIFIER CIRCUIT

Filed Jan. 31, 1961 2 Sheets-Sheet 2

Inventor:
Michael J. Cudahy

By Merriam, Smith, & Marshall,
Attys.

United States Patent Office 3,185,768
Patented May 25, 1965

3,185,768
AMPLIFIER CIRCUIT

Michael J. Cudahy, Skokie, Ill., assignor to Cozzens & Cudahy, Inc., Skokie, Ill., a corporation of Illinois Filed Jan. 31, 1961, Ser. No. 86,040
5 Claims. (Cl. 179—1)

Figure 1:
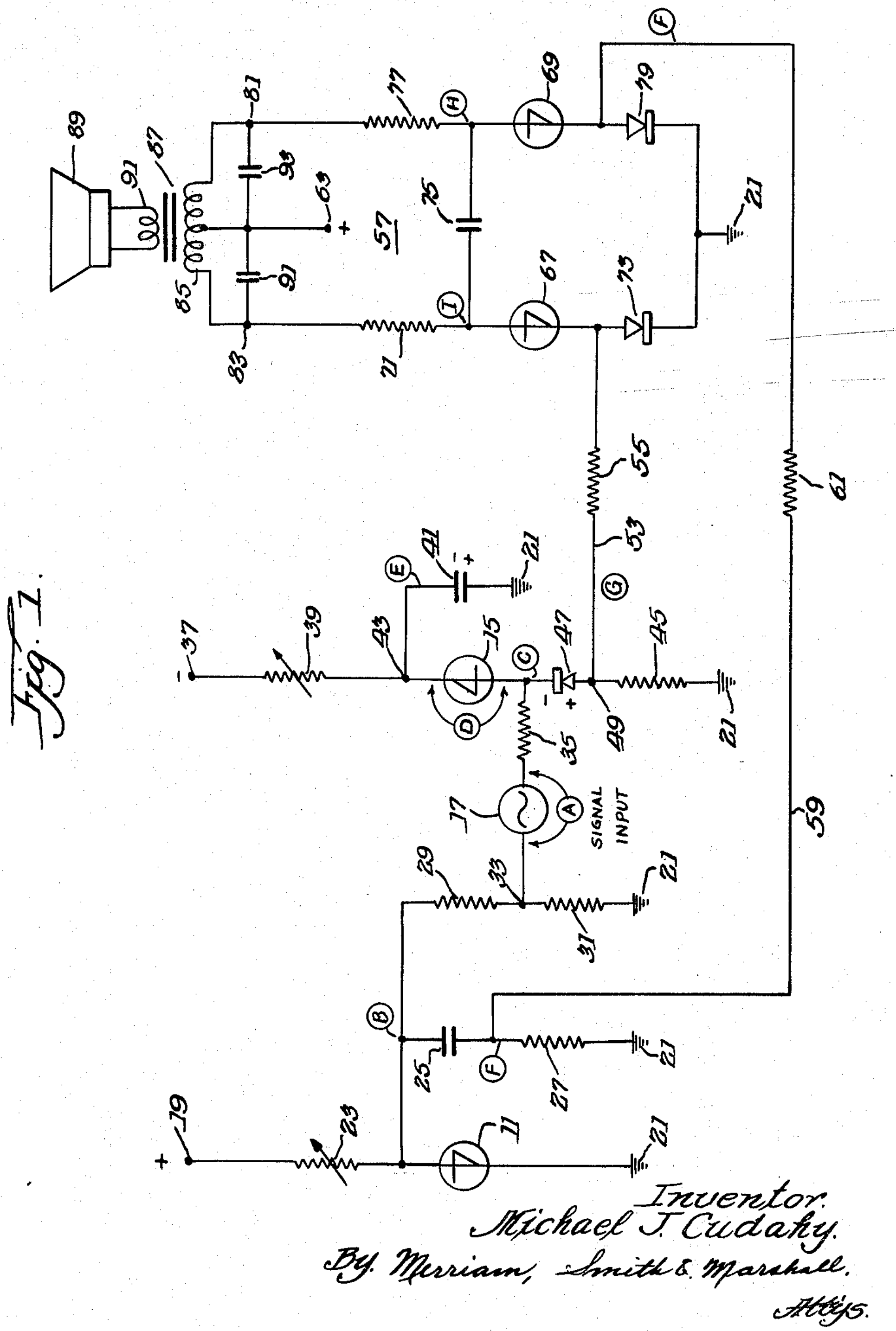

This invention relates to amplifiers and amplifier devices to provide distortion-free power amplification in wide frequency ranges.

The invention in one of its preferred forms as herein described by way of illustration will be considered in the complete range of audibility but it will be apparent that it is substantially free from frequency limitations except as the operating speeds of the described diode components necessitate. The circuit functions and operates essentially as a pulse width modulator with the pulse widths being determined by the controlling input signal and the tube and transistor types of linear amplifiers is avoided. In accordance with the invention a controlling input signal is impressed upon a suitable form of relaxation oscillator to modulate its output phase in relation with a second relaxation oscillator. The modulated pulses from these oscillators are then used to control a flip-flop circuit, such as a bi-stable multi-vibrator, designed to produce essentially rectangular waves shapes. The produced pulses then control and vary the symmetry of the flip-flop in accordance with the applied controlling signals. Any appropriate form of transducer, such as a loud speaker, a recorder or repeater, is utilized to sense variations in symmetry of the produced wave forms and from the produced and controlled waves recreate the original signal in amplified form.

In the preferred form of circuit herein to be described signal energy to be amplified is supplied to control the functioning of a suitbale form of modulating device which operates at a normal frequency which is preferably at least twice the maximum applied impressed frequency of which amplification is desired. The modulating signal controls the time of operation of one of a suitable pair of relaxation oscillators and varies its controlling effect to an extent such that saw-tooth wave forms, which are generated, are caused to appear in signal-determined relative phase relationship with respect to the other oscillator. The output thus becomes proportional to the impressed signals. The relaxation oscillators function to "fire" at suitable stable voltage values and when so firing discharge previously stored electrical charges from suitable capacitor elements and, in so doing, produce control energy pulses to determine the operation of a suitable flip-flop or multi-vibrator. The relaxation oscillators are normally symmetrical in their operation and departures from symmetry are introduced by an applied signal modulation. A control of the "firing" of one oscillator relative to the other thus changes the pulse separations. The pulses are used to determine the operating periods of a multi-vibrator or flip-flop unit which connects into a transducer in such fashion that the timing and alternation of the changes have the effect of an amplified signal component and provide the signal for energizing the controlled component.

The invention as herein to be disclosed has for one of its main objects that of providing circuitry for use in linear signal amplification which uses semi-conductor elements of various types as replacements for electron tubes and which require relatively low power for their operation and yet functions without warm-up time and with great efficiency. Further objects are those of improving distortionless amplification of signals over a wide frequency operating range. Many other objects and advantages of the invention will become apparent after reading the following description and accompanying claims in connection with the drawings and include increased fidelity of circuit operation, reduction in operating costs, quickness in starting, simplicity of circuit connections, and reduced power consumption, to name but a few.

Figure 2:
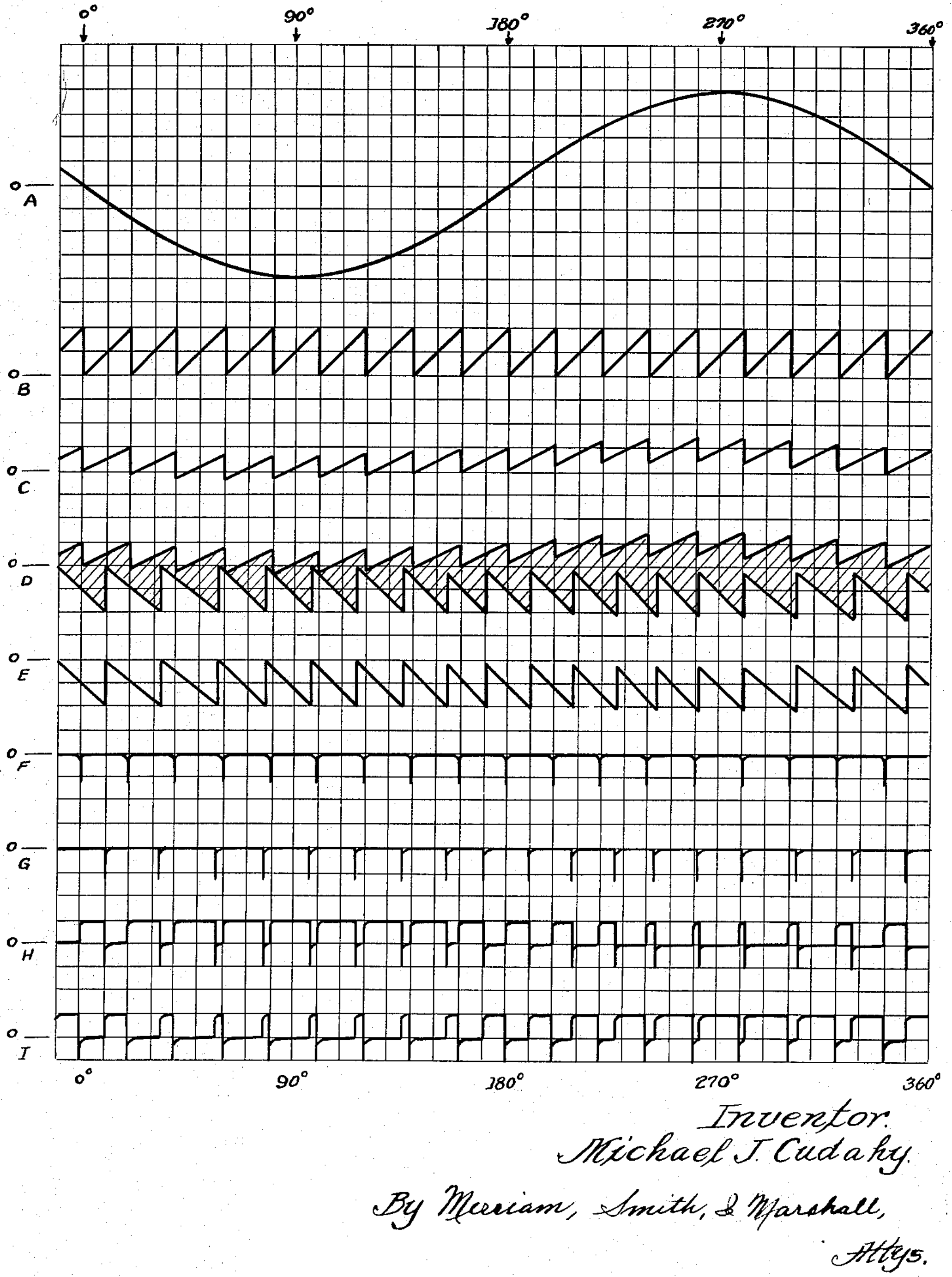

The accompanying drawings illustrate a preferred circuit for practicing the described invention and in these drawings FIGURE 1 illustrates in preferred form a circuit wherein the control is provided through the use of semi-conductor devices connected to provide pulse width modulation control of a flip-flop or multi-vibrator in accordance with an input signal and FIGURE 2 comprises a set of curves describing the invention in its preferred form and from which the various component-parts A through I designate approximately the signal wave form available at different points in the circuit of FIGURE 1 which bear like letter identification.

Making reference now to the drawings for a particular description of the invention, a relaxation combination is disclosed wherein semi-conductor units 11 and 15, as will be hereinafter explained and when connected in accordance with the principles herein explained, serve to produce pulse outputs which may be caused to vary and depart from symmetrically timed relationship in accordance with an applied controlling signal. Such a control signal may be applied at the input element 17 and may be assumed to have a wave form schematically represented at A (FIGURE 2) of the drawings.

The diodes or semi-conductors 11 and 15, while being subject to wide modifications of type, are nonetheless customarily those which are known in the art as the Shockley type 4D–40–10, which is a commonly used type and has a firing voltage of approximately 40 volts. Other equivalent components may also be used. The unit 11 is connected at one of its terminals to a positive voltage supply from a source (not shown) which has its positive terminal connected at point 19 and its negative terminal preferably connected to ground 21 to which point the second terminal of unit 11 is connected. A suitable potentiometer 23 is series connected between the positive terminal of the source and the semi-conductor 11 and one terminal of condenser 25. The voltage of the source 19 is arranged to charge the condenser 25 through potentiometer 23. The condenser 25 has its lower terminal connected to ground 21 through the resistor 27. A charge is accumulated in the condenser 25 by current flowing in the circuit including the potentiometer 23 and the resistor 27.

Upon the charge on condenser 25 acquiring a magnitude corresponding to the operating or "firing" voltage of the semi-conductor 11, the charge will discharge through resistor 27 and the semi-conductor. The charge and discharge of condenser 25 produces a saw-tooth wave form, as indicated by the voltage B and shown by the saw-tooth wave form of the corresponding curve on FIGURE 2 at the junction of the upper plate of the condenser and its connection to the diode 11. A pulse is developed at point F (junction of condenser lower plate and upper end of resistor 27) to be used as a control pulse for the flip-flop circuit 57 (later to be described). The time constant of the combination of the saw-tooth developing circuit is appropriately chosen so that the slope is substantially linear and the saw-tooth is of a frequency which is higher than the frequency of the assumed input, as will hereinafter be suggested.

The developed saw-tooth wave (curve B) is then passed to ground through the resistors 29 and 31, constituting a voltage divider. Resistor 29 is larger than resistor 31 so that a substantially reduced amplitude saw-tooth voltage is available at junction point 33 to be supplied to point C along with the impressed modulating voltage wave A supplied at 17 to aid in controlling the "firing" time of diode 15, as hereinafter explained. Resistor 35 is a decoupling resistor in the connecting path. The saw-tooth wave is of positive polarity (as diagrammed) when the polarity of the source is positive at terminal 19. It is, of course, apparent that the resistor 29 of the voltage divider through which the saw-tooth wave is passed may, if necessary, be by-passed by a capacity element to offset the capacitive load of the circuit and maintain improved linearity.

The second four-element semi-conductor 15 is connected in the opposite sense from the element 11 so that at the terminal point 37 the voltage of a source (not shown) is supplied with the source being poled negatively to the source 37 and positively relative to ground 21. Negative voltage is then supplied through the potentiometer 39 to charge the condenser 41 in a direction such that the potential at its upper plate, which connects to the junction point 43 at which the lower end of potentiometer 39 and one end-terminal of element 15 are connected, is such that the charge acquired by condenser 41 is of opposite polarity relative to ground to that of condenser 25, and is diagrammatically that represented by the curve E of FIGURE 2. It thus becomes apparent that while the voltage build-up across the condenser 25 is such that the potential at point B builds up positively relative to ground, the voltage build-up across the condenser 41 is negative relative to ground, as shown by the curve E.

With the voltage dividers 29 and 31 functioning and a small portion of the voltage across the condenser 25 thus being made available through resistor 35 to be applied to the lower conducting element of the semi-conductor 15, the semi-conductor 15 "fires," or is conductive, each time that the voltage difference across the semi-conductor between point C and point E equals the firing voltage (herein assumed as 40 volts for a semi-conductor of the Shockley type known as the 4D–40–10). This voltage is represented by the curve D of FIGURE 2.

Whenever the semi-conductor 15 is caused to conduct, it serves to discharge the stored charge on condenser 41 by the circuit which is formed from ground 21 through the discharge resistor 45 and the diode 47 and thus produces a negative pulse available at the junction point 49. The semi-conductors 11 and 15 which are cross-connected operate in substantial synchronism by reason of this fact and the phase relationship between these relaxation oscillators (assuming the source 17 forms a conductive path between the junction 33 of the lower end of resistor 29 and upper end of the resistor 31 on the one hand and resistor 35 on the other hand) is determined by the saw-tooth slope of each and the firing voltage of the semi-conductor components 11 and 15. The condensers 25 and 41 are preferably of like size and the remaining circuit parameters are so chosen that the saw-tooth waves E and B are of the same amplitude and frequency (with no modulation applied) and approximately 180° out-of-phase with each other. Barring a control voltage applied, the operation continues undisturbed with the voltage at point B, for instance, building up positively while the voltage at point E is simultaneously building up negatively.

If now it be assumed that a small alternating current voltage is applied across the input 17 a change in the firing point of the semi-conductor 15 will occur, with the application of the impressed signals being assumed to be that conventionally represented as the sine wave A shown on FIGURE 2. In this sense an impressed input wave across the input 17 serves to phase-modulate the developed pulses from the semi-conductors 11 and 15 after the symmetry has been established and, if necessary, adjusted and determined by an adjustment effected through the potentiometer 39.

Under such circumstances and with the impressed wave applied across the input 17, it becomes apparent that the voltage available at the terminal point C, with the input A applied, will be applied as a modulation of the saw-tooth by the impressed wave and consequently, for the wave input, the maximum and minimum instantaneous amplitudes of the saw-tooth C will vary at the frequency of the assumed sine wave input A, as is also illustrated by curve C.

The voltage effective on the semi-conductor 15 to bring it to a conducting or "firing" state then represents the combination of the saw-tooth wave C (as modified by the impressed sine wave A) and the saw-tooth wave E which is developed through the charge and discharge of the condenser 41. This voltage wave is represented as the wave D in FIGURE 2 and is the effective voltage instantly across the semi-conductor 15. The output pulse available which occurs when condenser 41 is discharged is then available at the upper terminal of the resistor 45 (see pulse wave G of FIGURE 2) and is supplied for the operation or "firing" and functioning of one-half of the multi-vibrator or flip-flop unit generally designated 57. At this point it is also desirable to note that the voltage wave in the form of pulses (curve F of FIGURE 2) developed across resistor 27 when condenser 25 discharges are supplied to control the "firing" or triggering of the other half of the multi-vibrator or flip-flop 57 by way of conductor 59 and resistor 61, later to be explained.

The diode 47 is so poled that it conducts in a direction to pass current through the discharge circuit of the condenser 41 through the semi-conductor 15 and functions in such a way that despite a relatively low value of resistance usually provided in the form of the resistor 45, the conductor 53 and the resistor 55, the input "sees" the load as a high impedence and as waves such as those represented by the wave form C are injected into point C they are unimpeded. The diode or crystal 47, while in many cases of varying types, is preferably one of the types known in the art as the Raytheon 1N68, although, here again, this is subject to wide choice.

In the multi-vibrator or flip-flop portion of the circuit herein disclosed a voltage source (not shown) has its positive terminal connected at the terminal point 63 and is poled positively with respect thereto. The negative terminal of the unillustrated voltage source may be assumed to be connected to ground, as at 21. According to this form of connection the flip-flop operation is such that it may be assumed first that the semi-conductor or diode 67 is conductive (the comlementary diode 69 is then cut off) so that current can then flow from the source (not shown) connected at terminal 63 and through resistor 71, which is of low value, and the diodes 67 and 73 to ground. This leaves the right hand plate of the commutating condenser 75 charged positively where it will remain until disturbed by discharge and the voltage at point I is almost zero. If now, however, a negative pulse F is applied as a negative voltage along conductor 59 to carry diode 69 to a conducting or "firing" state, condenser 75 will turn diode 67 off and recharge in the opposite polarity. The condition will be maintained unless diode 67 is again caused to "fire" (as first assumed).

This described operation causes the voltage at points I and H to shift oppositely and uniformly and the shift should be such that the time constant of resistor 71 and capacitor 75 or of resistor 77 and capacitor 75 is short in respect of the assumed frequency of the relaxation oscillators which produce the control pulses G and F. Also, the condenser 75 must be of such size that diodes 67 or 69 (as the case may be) can be cut off as it charges oppositely.

The output, in the form of the developed square-waves of curves H and I, is available at points H and I which connect through resistors 71 and 77 to the end terminals 83 and 81 of a transformer primary winding 85 of an output transformer 87 (here assumed as the load) which here may be considered to supply the output signals to a transducer 89 by way of the secondary winding 91. The transducer may be any form of utilization device such as the illustrated loud speaker, or it may be a recording unit or a vibration table or any other desired form of device.

In the event that no modulation is applied and symmetry of the relaxation oscillators is provided the flip-flop circuit 57 is operated at uniformly spaced time intervals with a result that the transducer receives square wave pulses occurring at the frequency of the relaxation oscillators and consequently the "net" signal of the transducer is zero. As symmetry is varied from side to side with an input signal applied at source 17 it can be seen that the "firing" of the diode 15 is either accelerated or delayed, depending upon signal polarity as added with the portion of the saw-tooth wave at point B which is effective at point C. This causes the discharge pulse available at point 49, and shown by curce G, which is applied to the semi-conductor or diode 67 by conductor 53 and resistor 55 to occur at an earlier or later point in the cycle of the relaxation oscillation which includes diode 11. This, then, moves in time the pulses G relative to the pulses F and, as becomes clear from curves H and I, has the effect at the transducer of recreating input signal and this signal is then effective at the transducer as if in series with resistors 71 or 77 as the case may be.

If desired a small capacity element (not shown) may be connected between each of points H and I and ground 21 to by-pass any undesirable "spikes" resulting from switching the diodes and discharging condenser 25 one way or the other. Also, if desired, small capacitor elements, such as 91 and 93, may be connected to offset the inductive load of a transducer (assuming an inductive load is selected). The transducer 89, as well as the ear of the listener, acts as an integrating component for identifying the change in symmetry of the square waves produced by the multi-vibrator. Thus, this aids in identifying and reproducing the original modulation signals induced at the input element 17.

While not in any respect to be considered as limiting, it may be noted that in one form of circuit the following parameters may be selected for parts not heretofore specified:

| | |
|---|---|
| Diodes **67** and **69** | Shockley 4J100–30. |
| Potentiometers **23** and **39** | 100,000 ohms. |
| Capacities **25** and **41** | 0.002 mf. |
| Resistors **27** and **45** | 270 ohms. |
| Resistor **29** | 220,000 ohms. |
| Resistor **31** | 68,000 ohms. |
| Resistor **35** | 1,000 ohms. |
| Resistors **55** and **61** | 180 ohms. |
| Resistors **71** and **77** | 150 ohms. |
| Diodes **73** and **79** | Type 1N537. |
| Diode **47** | Type 1N68. |
| Capacity **75** | 0.01 mf. |
| Source at point **19** | +130 volts. |
| Source at point **37** | −140 volts. |
| Source at point **63** | +60 volts. |

Other values may be selected where different time constants, operating frequencies and "firing" voltages are used. It also is possible to increase the frequency limit by increasing the carrier frequency.

Further modifications which fall fairly within the spirit and scope of the following claims will become apparent to those skilled in the art to which the invention is directed. As an illustration of one modification, the input signal source 17 supplying a modulating signal of suitable wave form [such, in instance, as that shown illustratively by wave A of FIG. 2] can be supplied in series with the diode 11 and the indicated ground connection 21, instead of supplying the modulation as presently shown. When the modulation is so applied in series with diode 11 it, of course, will control the firing point of the diode 11 rather than that of the diode 15, as hereinabove explained. Other operational features will be generally similar to those already expressed.

Other modifications will naturally follow from what is expressed.

What is claimed is:

1. An amplifying circuit comprising a pair of complementary relaxation oscillators, means to develop an energy pulse during each cycle of each oscillator operation, means to develop a pair of symmetrically shaped electrical waves of equal and opposite amplitude, means to supply input signals of varying amplitude and frequency for amplification, means controlled by the developed energy pulses to determine the symmetry of the electrical waves, signal controlled means to phase-modulate the output voltages from the relaxation oscillators relative to each other in proportion to the input signals available at the input means thereby to modify the time of occurrence of the developed pulses relative to each other and to vary under the control thereof also the symmetry of the developed waves, and means to supply the developed waves to a signal transducer for recreating the modulating signal.

2. An amplifying circuit comprising a pair of complementary relaxation saw-tooth wave oscillators, means to develop an energy pulse timed with the steep wave portion of each developed saw-tooth wave, means to develop a pair of symmetrically shaped electrical square waves of equal and opposite amplitude, means controlled by the produced pulses to establish the symmetry of the produced square-waves, means to supply input signals for amplification, signal controlled means to phase-modulate the relaxation saw-tooth wave oscillators relative to each other in proportion to applied input signal modulation thereby to modify the time of occurrence of the pulses to vary the symmetrical relationship of the developed square waves, and means to supply the developed square-waves to a signal transducer for recreating the modulating signal in amplified magnitude.

3. An amplifying circuit comprising a pair of relaxation oscillators each adapted to generate a saw-tooth shaped electrical wave normally uniformly time separated and of like frequency, means to develop controlling signal pulses from the saw-tooth waves generated, the pulses indicating the respective wave periods, multi-vibrator means adapted to produce alternately, upon triggering, square-wave outputs of each of two polarities, means to trigger the multi-vibrator means to produce the alternate pulses under the control of successive pulses developed by the relaxation oscillators, means to phase-modulate one of the relaxation oscillators relative to the other in accordance with an applied input signal thereby to vary the relative time separation between the developed pulses therefrom and to control simultaneously the timing and triggering of the multi-vibrator operation, and means to supply the multi-vibrator output to a transducer for recreating the modulating signal.

4. An amplifying circuit comprising means to supply an input signal, a pair of relaxation oscillators each including a charge storage element adapted to be charged from a source of current, a discharging path for discharging the storage element of each of the relaxation oscillators comprising a semi-conductor device and a resistive element, the combination being adapted to develop a saw-tooth wave form across the charge storage element and a pulse wave form across the resistive element, voltage divider means for supplying a reduced amplitude saw-tooth wave from one of the relaxation oscillators to the other to modify the normal operating cycle thereof, a square-wave multi-vibrator including a capacitor adapted to be charged alternately positively and negatively relative to a point of fixed potential and a plurality of discharge paths each including a semi-conductor for selectively discharging the stored charge from the capacitor, means responsive to the charge on the capacitor of the multi-vibrator to energize a transducer, means to control the multi-vibrator to determine the polarity of charge of the capacitor in accordance with the pulses developed by the relaxation oscillator and to switch the direction of charge of the capacitor alternately positive and negative in accordance with the pulse timing, and means to supply the signal input to the relaxation oscillators to pulse-width modulate the oscillator output and thereby control, in proportion to the said signals, the triggering of the multi-vibrator determining the useful output current flow to the said means to energize said signal transducer.

5. An amplifying circuit comprising a pair of complementary saw-tooth oscillators adapted to develop saw-tooth waves of opposite polarity and in predetermined timed relationship, each producing an energy pulse during the retrace period of each saw-tooth cycle, a flip-flop oscillator to develop a pair of symmetrically shaped substantially square electrical waves of equal and opposite amplitude, semi-conductor means responsive to the produced pulses to determine the symmetry of the produced square waves, means to supply input signals of varying amplitude and frequency for amplification, signal controlled means to phase-modulate the saw-tooth oscillators relative to each other in proportion to the applied input signals, thereby to modify the relative time separation of the pulses to establish departures from symmetry of the square waves, and means to supply the square waves to a signal transducer and thereby recreate the control signal in amplified form.

References Cited by the Examiner

UNITED STATES PATENTS

| | | | |
|---|---|---|---|
| 2,556,457 | 6/51 | Watts | 332—14 |
| 2,864,905 | 12/58 | Grantges et al. | 330—10 |
| 2,913,675 | 11/59 | Curtis | 332—9 |
| 2,950,352 | 8/60 | Belck | 332—9 X |
| 3,013,162 | 12/61 | Antista | 332—9 |
| 3,079,539 | 2/63 | Guerth | 332—9 X |
| 3,112,365 | 11/63 | Kihara | 179—1 |

OTHER REFERENCES

Shockley Transistor Corporation Application Data, No. AD-1, December 1958.

| Section: | Pages |
|---|---|
| Shockley Transistor Diodes | 4 |
| Rate Effect | 2, 4 |
| Multivibrator Circuits | 3, 4 |

ROBERT H. ROSE, *Primary Examiner.*

L. MILLER ANDRUS, WILLIAM C. COOPER, *Examiners.*